United States Patent [19]

Tews et al.

[11] Patent Number: 5,436,475

[45] Date of Patent: Jul. 25, 1995

[54] BIPOLAR TRANSISTOR FOR HIGH POWER IN THE MICROWAVE RANGE

[75] Inventors: Helmut Tews, Unterhaching; Hans-Peter Zwicknagl, Stuttgart, both of Germany

[73] Assignee: Siemens Aktiengesellschaft, Munich, Germany

[21] Appl. No.: 246,481

[22] Filed: May 19, 1994

Related U.S. Application Data

[63] Continuation of Ser. No. 74,735, Jun. 10, 1993, abandoned, which is a continuation of Ser. No. 751,413, Aug. 28, 1991, abandoned.

[30] Foreign Application Priority Data

Sep. 20, 1990 [DE] Germany ............... 40 29 818.3

[51] Int. Cl.[6] ............... H01L 29/161; H01L 29/205; H01L 29/225
[52] U.S. Cl. ............... 257/197; 257/514; 257/515; 257/517; 257/520; 257/579; 257/584
[58] Field of Search ............... 357/34, 36; 257/197, 257/565, 584, 586, 587, 514, 515, 517, 520, 563, 579, 580; 437/31

[56] References Cited

U.S. PATENT DOCUMENTS

| | | | |
|---|---|---|---|
| 4,291,319 | 9/1981 | Carinalli | 357/13 |
| 4,338,138 | 7/1982 | Cavaliere et al. | 148/1.5 |
| 4,635,087 | 1/1987 | Birrittella et al. | 357/38 |
| 4,677,455 | 6/1987 | Okajima | 357/38 |
| 4,686,557 | 8/1987 | Mahrla | 357/34 |
| 4,939,526 | 7/1990 | Alderstein | 257/197 |
| 4,939,562 | 7/1990 | Alderstein | 357/34 |
| 5,073,812 | 12/1991 | Shimura | 357/34 |
| 5,095,351 | 3/1992 | Gotou | 357/34 |
| 5,124,270 | 6/1992 | Morizuka | 437/31 |

FOREIGN PATENT DOCUMENTS

| | | | |
|---|---|---|---|
| 0309784 | 4/1989 | European Pat. Off. | H01L 29/52 |
| 0326828 | 8/1989 | European Pat. Off. | H01L 29/72 |
| 0416166A1 | 3/1991 | European Pat. Off. | H01L 29/73 |
| 0314240 | 1/1991 | Japan. | |
| 0342841 | 2/1991 | Japan. | |
| 3291942 | 12/1991 | Japan. | |

OTHER PUBLICATIONS

Wang et al., "Design Optimization of Microwave Power Heterojunction Bipolar Transistor Cells", IEEE MTT-S Digest, 1989, pp. 1061–1064.
Electronics Letters, Jul. 20, 1989, vol. 25, No. 15, "2–5W, C-Band, GaAs/AlGaAs Heterojunction Bipolar Power Transistor", pp. 979–981.

Primary Examiner—Rolf Hille
Assistant Examiner—Valencia Martin Wallace
Attorney, Agent, or Firm—Hill, Steadman & Simpson

[57] ABSTRACT

A power transistor has a plurality of small emitter-base complexes arranged in an array. These complexes are electrically insulated from the surrounding semiconductor material by separating regions such that for the current supply to the collectors, a joint subcollector layer and thereupon a collector metallization exist outside of the emitter-base complexes and reaching up to the separating regions. The individual emitter-base complexes are electrically connected with each other via strip-shaped base supply lines and strip-shaped emitter supply lines, and also with a base contact surface and an emitter contact surface.

11 Claims, 4 Drawing Sheets

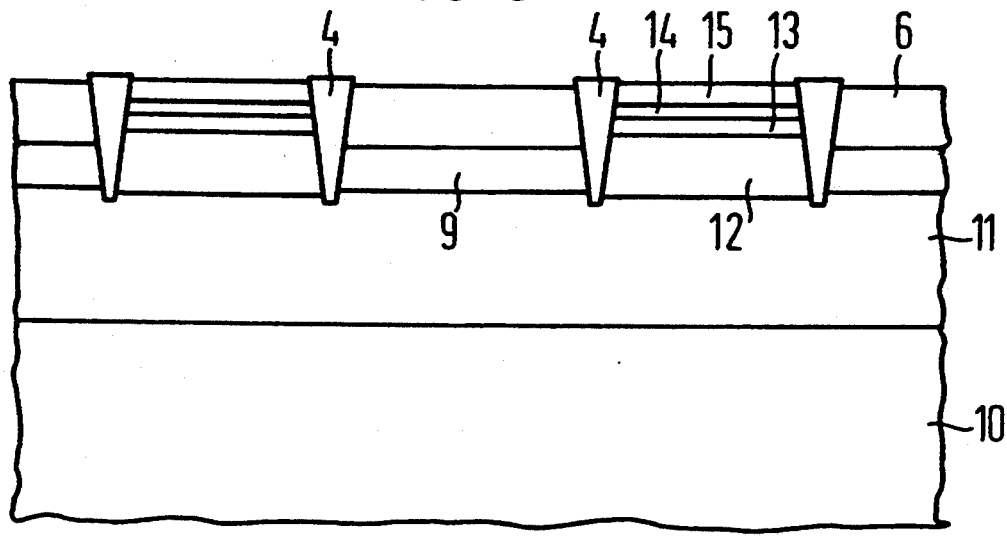
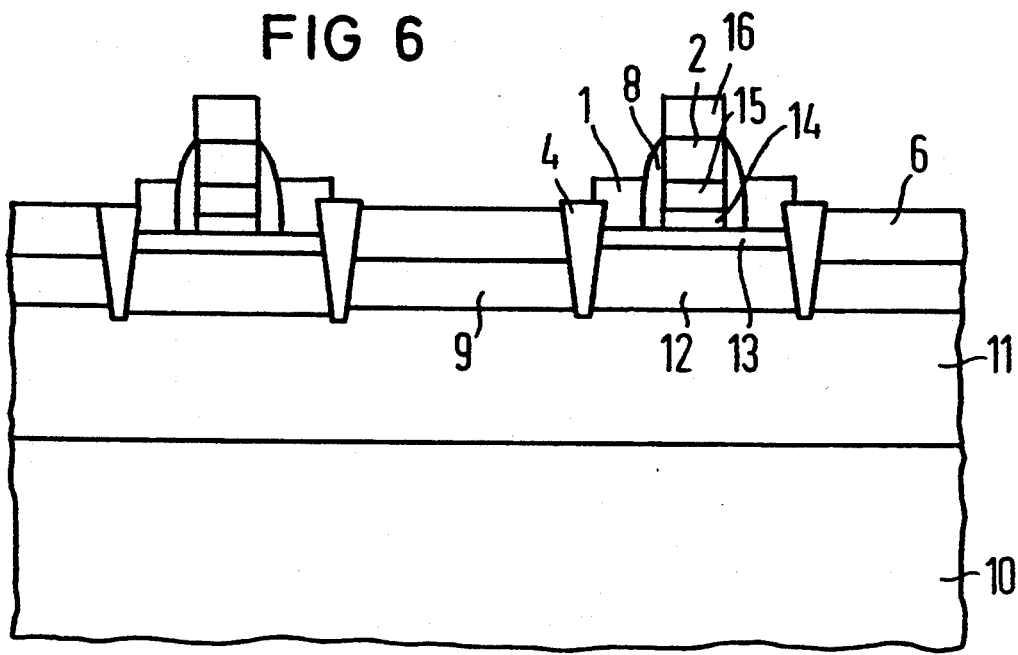

BIPOLAR TRANSISTOR FOR HIGH POWER IN THE MICROWAVE RANGE

This is a continuation of application Ser. No.08/074,735, filed Jun. 10, 1993, now abandoned, which is a continuation of application Ser. No. 07/751,413, filed Aug. 28, 1991, now abandoned.

BACKGROUND OF THE INVENTION

The present invention is directed to a power transistor for the microwave range.

Power transistors are usually designed as structures with several strip-shaped emitter supply lines ("Multi-Emitter Finger-Structures") (see e.g. G. W. Wang et al: "Design Optimization of Microwave Power Heterojunction Bipolar Transistor Cells," 1989 IEEE MTT-S Digest, 1061–1064 and A. P. Long et al: "2.5 W, C-volume, GaAs/AlGaAs Heterojunction Bipolar Power Transistor," Electr. Lett. 25, 979–981 (1989)), both incorporated herein. In the heterobipolar transistor, the observed thermal resistance leads to increased operating temperatures in comparison to MESFET power transistors. This significantly limits the CW power output. The high breakthrough voltages at the heterobipolar transistor and the possibility to handle currents of high intensity can therefore not be optimally used. Desirable are power transistors which can be operated up to frequencies in the microwave range (10 to 100 GHz) with high outputs (e.g. 5 W at 30 GHz).

SUMMARY OF THE INVENTION

It is an object of the present invention to specify a power transistor for application in the microwave range which can be manufactured easily and which maintains a low operating temperature given a high power output.

The power transistor of the invention solves the above problem. It is structured in the shape of an array of a plurality of small self-adjusted symmetrical emitter-base regions (emitter-base complex, inner transistor). The inner transistor, i.e. the base-emitter complex, is dimensioned according to the desired microwave range. The small emitter sections or emitter-base sections permit a reduction of the base-emitter capacitance and the base-collector capacitance and lead to a reduction of the emitter and collector charging times in the transistor. According to the invention, this plurality of small emitter-base complexes is electrically connected with each other in joint fashion via strip-shaped supply lines. These supply lines respectively lead to contact surfaces on the surface of the power transistor. Each emitter-base complex is limited all around by a collector trench as it is described in European application EP 89116665.4, incorporated herein. These collector trenches reach from the surface of the power transistor into a subcollector layer. Via this subcollector layer, the current supply in the actual collector layer of the individual transistors occurs. The collector trenches which surround the emitter-base regions all around are filled with a passivation composed of dielectric material. The collector metallization is applied as a metal layer on this subcollector layer. The individual collector trenches and the respective area of the base-emitter regions surrounded by them form cutouts/recesses in this collector metallization which is otherwise applied over the entire surface. This collector metallization therefore has a reticular structure and reaches all around to the collector trenches. In this way, this collector metallization causes the heat generated in the individual transistors to be conducted via this collector metallization in very good fashion. The collector contact area resides outside the region taken up by the power transistor array, on the layer of the collector metallization, or on another metal layer applied thereon.

BRIEF DESCRIPTION OF THE DRAWINGS

FIGS. 3 to 6 show the power transistor according to the invention in cross-section, respectively, at various stages of manufacture.

DESCRIPTION OF THE PREFERRED EMBODIMENTS

Figure 1:
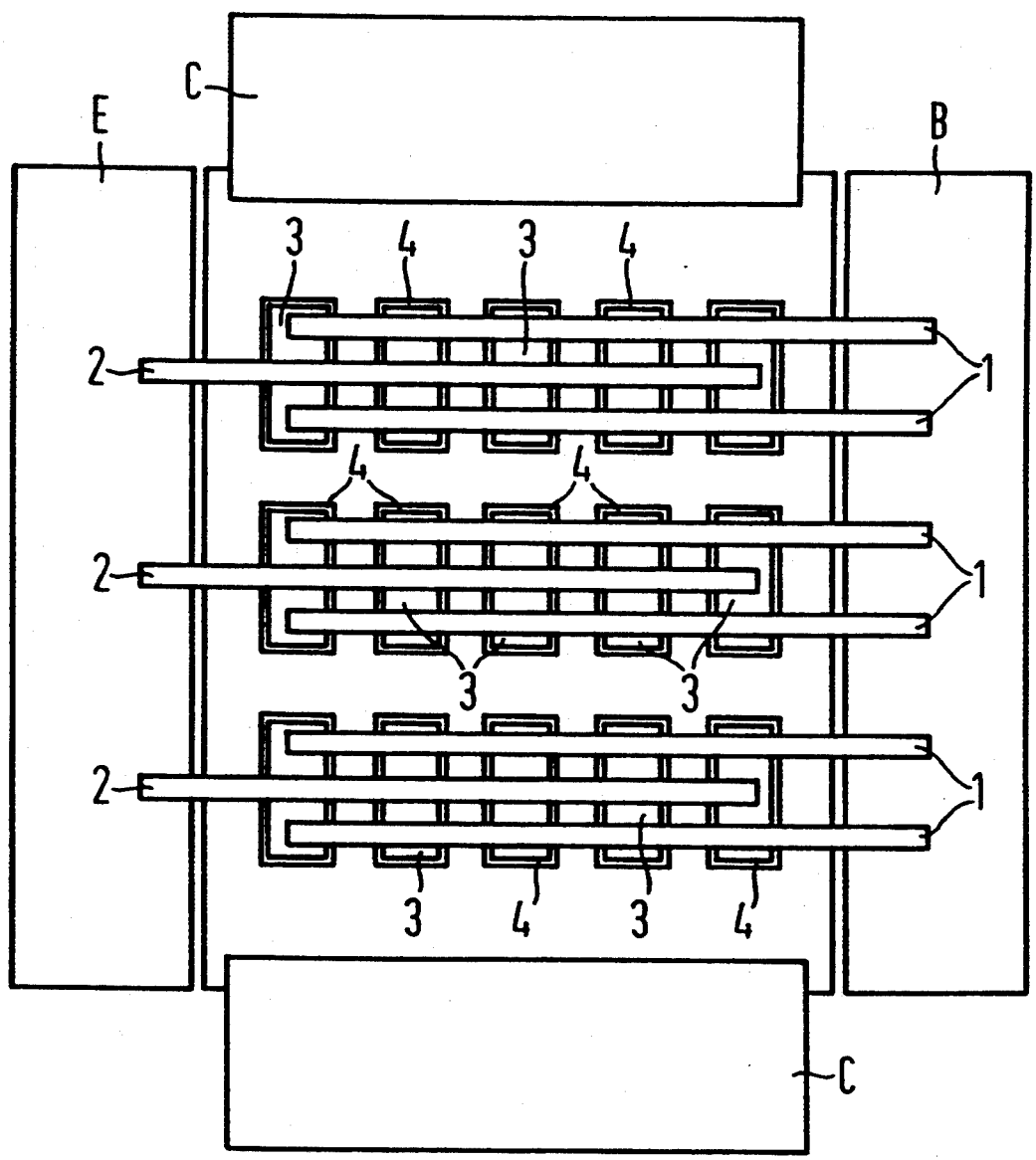
FIG. 1 show plan view of the arrangement of the invention.

FIG. 1 shows an arrangement of 15 transistors arranged in three rows. The actual collector respectively resides under the emitter-base complex 3. Every emitter-base complex 3 is separated from the subcollector, i.e. the collector terminal, by a collector trench 4. Parting sectioning areas which surround the emitter-base complexes can be generated with spacers instead of these collector trenches. The emitter metallizations are electrically connected with the emitter contact surface E via emitter supply lines 2. Correspondingly, the base metallizations are electrically connected with the base contact surface B via base supply lines 1. Collector contact surfaces C are also provided lying over a portion of collector metallization 9 and electrically connected to collector metallization 9, show in FIG. 6. In the example of FIG. 1, respectively two base supply lines 1 (base fingers) and one emitter supply line 2 (emitter finger) are present for each row of transistors. Correspondingly, an arrangement of the emitter-base complex with respectively two emitter supply lines 2 and respectively one base supply line 1 for every row of transistors is possible. Expediently, these base supply lines and emitter supply lines are applied directly on the areas of the base layers or the emitter layers provided for the contacting so that these base supply lines 1 and emitter supply lines 2 simultaneously function as the actual base metallization or emitter metallization. Between the individual transistors, that is particularly in the area outside of the regions surrounded by the collector trenches 4, the base supply lines 1 and the emitter supply lines 2 are guided over an electrically insulating passivation composed of dielectric material in order to insulate the metallic supply lines from the semiconductor material located therebelow.

The number of the inner transistors which are respectively electrically connected with each other via a base supply an emitter supply line 2 is determined by the tolerable voltage drop between the first and the last transistor of such a row along the base supply lines or the emitter supply line. An array according to the invention can basically be composed of a random number of such rows of individual transistors, whereby, however, the distance between the rows must be taken into account when dimensioning the transistor. In the areas respectively outside of the regions surrounded by the collector trenches 4 on the level of the collector layer, i.e. directly on the subcollector layer, the inner transistors are surrounded with the network of the buried collector metallization covered with a passivation. The collector metallization is provided for the contacting of the collectors of the inner transistors via the subcollector layer and for the rapid heat dissipation and heat distribution in the array. The current supply to the collectors occurs via the collector contact surface C.

Figure 2:
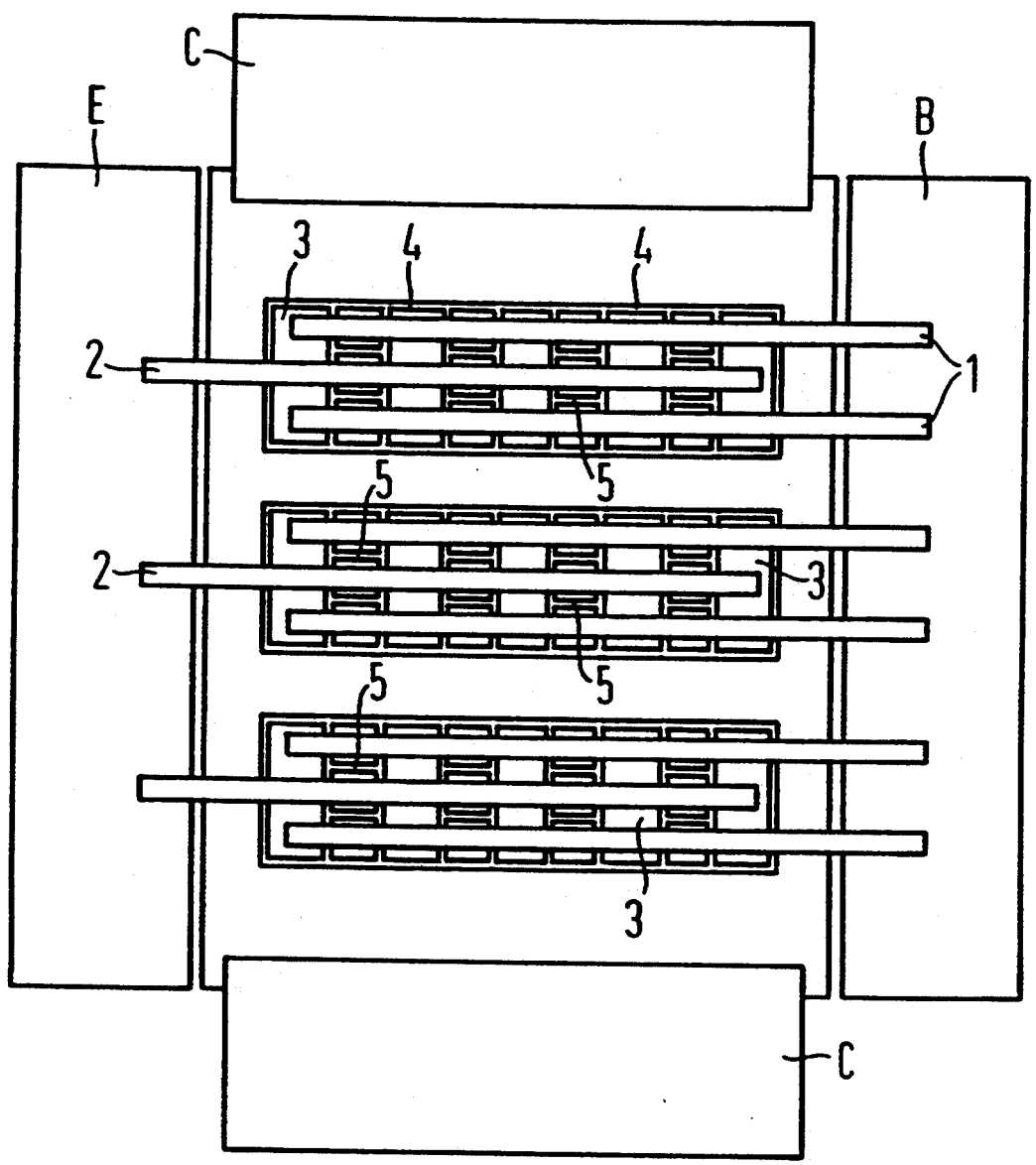
FIG. 2 shows a plan view of an alternative arrangement of the invention.

FIG. 2 likewise shows a plan view of an alternative embodiment. In this variation, the parasitic line capacities/capacitances between the inner transistors of a row are once more reduced. In addition to the collector trenches 4, intermediate trenches 5 are provided. These intermediate trenches 5 proceed on both sides of the base supply lines 1 and the emitter supply lines 2 and are arranged in parallel fashion to these supply lines respectively in the areas between two successive transistors. The intermediate trenches 5 reach all the way to the substrate 10. The intermediate trenches 5 are preferably etched-out trenches filled with an insulating passivation, or trench-shaped areas of the semiconductor material rendered semi-insulating by an implantation. Instead of trenches, these additional insulating areas can also be sections filled with dielectric material over the entire surface. In the regions surrounded by the intermediate trenches 5, the collector metallization is recessed. The current supply to the collectors as well as the abduction and distribution of the developing heat occurs via the collector metallization in the area between the rows of the transistors.

Figure 3:
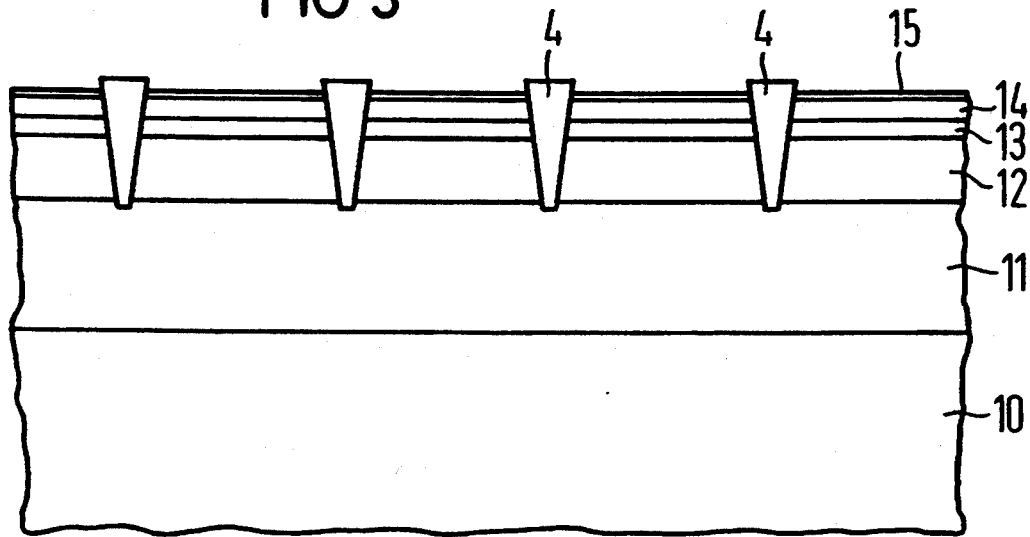
Figure 4:
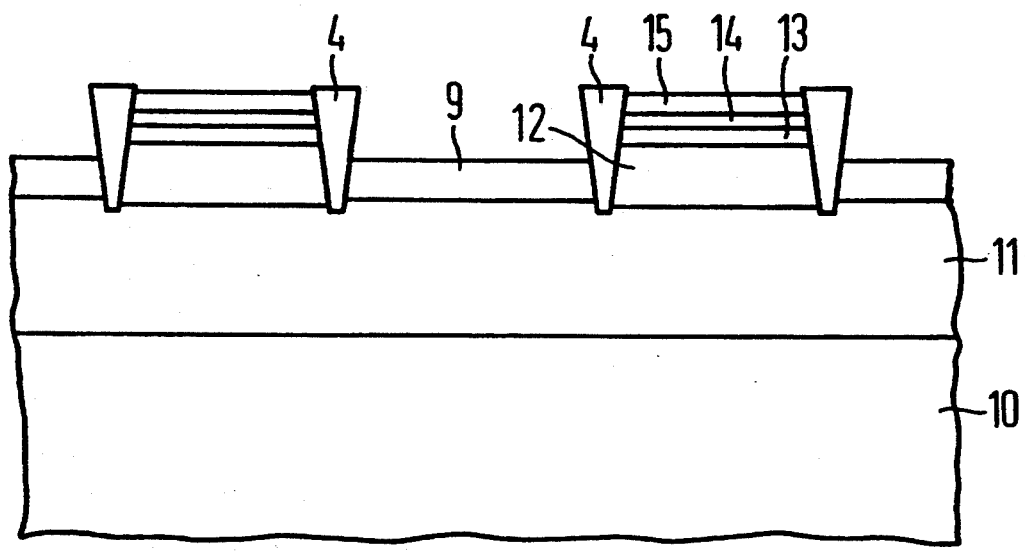

A particularly advantageous embodiment of the power transistor of the invention can be generated as presented in FIGS. 3 to 6 in cross-section. On a substrate 10, the subcollector layer 11, the collector layer 12, the base layer 13, the emitter layer 14, and the emitter contact layer 15 are grown. The collector trenches as separating regions 4 for the emitter-base complexes to be manufactured are generated by means of dry-etching or wet-chemical etching. In FIG. 3, these separating regions 4 are filled with a passivation composed of an electrically insulating material (e.g. $Si_3N_4$) and are planarized in their depth, the etched-out collector trenches reach at least to the surface of the overgrown subcollector layer 11.

Outside of the regions surrounded by the separating regions 4, the layer sequence is removed down to the subcollector layer 11. The surface of the subcollector layer 11 is then covered with the collector metallization 9. This collector metallization 9 is applied such that it reaches up to the separating regions 4.

As presented in FIG. 5, a passivation 6 formed of dielectric material (e.g. $Si_3N_4$) is applied on the collector metallization 9. The spaces between the emitter-base complexes are filled with this passivation and the surface is planarized. This leads to a buried, thermically and electrically well conductive network composed of metal with a very good heat contact to the individual transistors. It is important that the strip width of the metallization can be selected big so that a heat quantity as it usually develops during the operation of a power transistor can be conducted away.

FIG. 6 shows a cross-section through a finished power transistor of the invention. In this cross-section, two emitter-base complexes of the array with a self-adjusted arrangement of base terminal (base supply line) 1 and emitter terminal (emitter supply lie 2 are shown. One possible generation of this self-adjusted emitter-base region is the following. After the application of the emitter supply line 2, first the emitter contact layer 15 is etched selectively in a dry-etching step up to the emitter layer 14 (as previously indicated, the emitter supply line can also simultaneously function as an emitter metallization). Thereafter, the emitter layer 14 to the base layer 13 is selectively etched. The emitter supply line 2 and the emitter contact layer 15, as well as the emitter layer 14, are laterally provided with a spacer 8 composed of electrically insulating material. The base supply line 1 is now applied over the exposed base layer 13, the spacer 8, and the emitter supply line 2, and is levelled with a planarization resist (as previously indicated, the base supply line can simultaneously function as a base metallization without the need for a separate contact);

The planarization resist and one part of the base supply line are etched away (e.g. with ECR-RIE) until the electrical separation of the base supply line 1 and the emitter supply line 2 is achieved by the spacer 8 a portion 16 of the base supply line remaining on top of the emitter supply line 2. In an alternative embodiment, the base metallizations and the emitter metallizations can also be applied separately and subsequently connected with one another in electrically conductive fashion with base supply lines 1 and emitter supply lines 2.

The described manufacturing of the power transistor of the invention is compatible with the back surface process usual in the case of power transistors, as well as with a front side process. For higher powers, several transistor arrays according to the invention can be connected together. The transistor array according to the invention can be implemented without limitation for all semiconductor layer systems, which are usual in the case of hetero bipolar transistors (e.g. AlGaAs/GaAs, InGaAs/InP, SiGe/Si, etc.).

Special advantages of the power transistor of the invention are:

1) Better high frequency properties—the transit frequency of the power transistor according to the invention is higher than in the case of conventional power transistors and the maximum oscillator frequency is very much higher given the structure of the invention than with conventional power transistors; and
2) The structure of the invention is a decentralized, distributed arrangement of many small heat sources from which the developing heat can be dissipated better than from one single spatially far extended heat source.

The power transistor of the invention reduces parasitic capacitances to a minimum and guarantees, at least approximately, equal operating conditions for all inner transistors that are connected in the array.

At the same time, the heat developing during the operation is evenly distributed and effectively conducted away.

Although various minor changes and modifications might be proposed by those skilled in the art, it will be understood that we wish to include within the claims of the patent warranted hereon all such changes and modifications as reasonably come within our contribution to the art.

We claim as our Invention:
1. A power transistor, comprising:
   a base contact surface, an emitter contact surface, and a collector contact surface;
   a substrate;
   a subcollector layer on the substrate, a plurality of emitter/base complexes over the sub-collector layer and each comprising one emitter, one base, and one collector, and each emitter/base complex being surrounded by a separating region defining a collector trench ad which reaches into said subcol- lector layer, the emitter/base complexes being positioned between the base contact surface and emitter contact surface and the collector contact surface being positioned outwardly of the emitter/base complexes;

a strip-shaped base supply line arranged to electrically connect the base of each emitter/base complex with the base contact surface;

a strip-shaped emitter supply line arranged to electrically connect the emitter of each emitter/base complex with the emitter contact surface;

a collector metallization on an entire surface of the subcollector layer opposite the substrate outside of areas surrounded by said separating regions, cut-out areas being provided in said metallization defined by said separating regions;

said collector metallization extending to and completely surrounding every separating region and also to and in electrical connection with said collector contact surface; and a dielectric material passivation layer on the collector metallization and extending to every separating region.

2. A power transistor according to claim 1 wherein said emitter/base complexes have a collector layer, a base layer, an emitter layer, an emitter contact layer, a base metallization, and an emitter metallization, the emitter metallization being separated from the base metallization by spacers, said base supply lines simultaneously functioning as said base metallizations and said emitter supply lines simultaneously functioning as said emitter metallizations.

3. A power transistor according to claim 1 wherein the separating regions comprise trenches.

4. A power transistor according to claim 3 wherein the separating regions are filled with a passivation formed of a dielectric material.

5. A power transistor according to claim 1 wherein said separating regions are defined by insulating regions in the semiconductor material.

6. A power transistor according to claim 1 wherein said separating regions are defined by spacers which limit in all-around fashion the emitter/base complexes, and which are formed of dielectric material.

7. A power transistor according to claim 1 wherein the subcollector layer is arranged on said substrate, wherein on both sides of the base supply lines and proceeding in parallel fashion to the base supply lines further separating regions are provided extending to said substrate, on both sides of said emitter supply line and proceeding in parallel fashion to the emitter supply lines further separating regions being provided, and said further separating regions being respectively arranged between two emitter/base complexes succeeding one another along a base supply line and extending to the separating regions surrounding these emitter-base complexes.

8. A power transistor according to claim 7 wherein said further separating regions are designed in the same fashion as said separating regions.

9. A power transistor according to claim 7 wherein areas surrounded by the further separating regions are filled over their entire surface with dielectric material.

10. A power transistor, comprising:

a base contact surface, an emitter contact surface, and a collector contact surface;

a substrate;

a subcollector layer on the substrate, a plurality of emitter/base complexes over the sub-collector layer and each comprising one emitter, one base, and one collector layer, and each emitter/base complex being surrounded by an at least semi-insulating separating region defining a collector trench and which reaches into said subcollector layer, the emitter/base complexes being positioned between the base contact surface and emitter contact surface and the collector contact surface being positioned outwardly of the emitter/base complexes;

a strip-shaped base supply line arranged to electrically connect the base of each emitter/base complex with the base contact surface;

a strip-shaped emitter supply line arranged to electrically connect the emitter of each emitter/base complex with the emitter contact surface;

the collector layer being positioned between the base and the sub-collector layer;

a collector metallization opposite the substrate on an entire surface of the subcollector layer outside of areas surrounded by said separating regions, cut-out areas being provided in said metallization defined by said separating regions;

said collector metallization extending to and completely surrounding every separating region and also to and in electrical connection with said collector contact surface; and a passivation layer on the collector metallization and extending to every separating region.

11. A power transistor, comprising:

a base contact surface, an emitter contact surface, and a collector contact surface;

a substrate;

a subcollector layer over the substrate, a plurality of emitter/base complexes over the sub-collector layer and each comprising one emitter, one base, and one collector layer, and each emitter/base complex being surrounded by a separating region defining a collector trench and which reaches into said subcollector layer, the emitter/base complexes being positioned between the base contact surface and emitter contact surface and the collector contact surface being positioned outwardly of the emitter/base complexes;

a base supply line arranged to electrically connect the base of each emitter/base complex with the base contact surface;

an emitter supply line arranged to electrically connect the emitter of each emitter/base complex with the emitter contact surface;

the collector layer being positioned between the base and the subcollector layer;

a collector metallization on an entire surface of the subcollector layer opposite the substrate outside of areas surrounded by said separating regions and an electrical contact with said collector contact surface, cut-out areas being provided in said metallization defined by said separating regions so that the collector metallization extends to and completely surrounds each separating region; and a passivation layer on the metallization.

* * * * *